US012749655B2

(12) United States Patent
Hammond, IV et al.

(10) Patent No.: US 12,749,655 B2
(45) Date of Patent: Sep. 29, 2026

(54) SPLITTER CIRCUIT FOR WAFER PROCESSING SYSTEM

(71) Applicant: Applied Materials, Inc., Santa Clara, CA (US)

(72) Inventors: Edward P. Hammond, IV, Hillsborough, CA (US); David Coumou, Santa Clara, CA (US); Upendra Ummethala, Santa Clara, CA (US)

(73) Assignee: Applied Materials, Inc., Santa Clara, CA (US)

(*) Notice: Subject to any disclaimer, the term of this patent is extended or adjusted under 35 U.S.C. 154(b) by 93 days.

(21) Appl. No.: 18/746,844

(22) Filed: Jun. 18, 2024

(65) Prior Publication Data

US 2025/0385075 A1 Dec. 18, 2025

(51) Int. Cl.
*H01J 37/32* (2006.01)

(52) U.S. Cl.
CPC . *H01J 37/32183* (2013.01); *H01J 2237/3321* (2013.01); *H01J 2237/3387* (2013.01)

(58) Field of Classification Search
None
See application file for complete search history.

(56) References Cited

U.S. PATENT DOCUMENTS 4,282,077 A 8/1981 Reavill
4,381,965 A 5/1983 Maher, Jr. et al.
4,887,005 A 12/1989 Rough et al.
5,349,313 A 9/1994 Collins et al.
6,199,506 B1 3/2001 Hilliker et al.
7,570,130 B2 8/2009 Sorensen et al.
7,811,410 B2 10/2010 Leming et al.
8,282,983 B1 10/2012 Kapoor et al.
9,263,350 B2 2/2016 Kapoor et al.
10,145,010 B2 12/2018 Kapoor et al.
(Continued)

FOREIGN PATENT DOCUMENTS

CN 109216147 A 1/2019
EP 0756309 A1 1/1997
KR 100934402 B1 12/2009

OTHER PUBLICATIONS

International Search Report and Written Opinion for International Application No. PCT/US2025/033891 dated Oct. 21, 2025.

*Primary Examiner* — Srinivas Sathiraju
(74) *Attorney, Agent, or Firm* — Patterson + Sheridan, LLP

(57) ABSTRACT

The present disclosure describes a semiconductor wafer processing system that uses a splitter circuit to delivery RF power from a power supply to multiple process chambers. The wafer processing system includes a first process chamber, a second process chamber, a power supply, a match circuit, and a splitter circuit. The power supply produces an electric current. The match circuit receives the electric current from the power supply and presents an impedance to the power supply. The splitting circuit includes a first leg and a second leg. The first leg includes a first capacitor that directs a first portion of the electric current from the match circuit to the first process chamber. The second leg includes a second capacitor that directs a second portion of the electric current from the match circuit to the second process chamber.

20 Claims, 7 Drawing Sheets

(56) References Cited

U.S. PATENT DOCUMENTS

| | | | | |
|---|---|---|---|---|
| 10,187,032 | B2 | 1/2019 | Kapoor et al. | |
| 10,666,218 | B2 | 5/2020 | Leeser et al. | |
| 10,991,550 | B2 | 4/2021 | Juco et al. | |
| 11,923,172 | B2 | 3/2024 | Ponnekanti et al. | |
| 11,984,298 | B2 * | 5/2024 | Juco | H01J 37/32183 |
| 11,994,542 | B2 * | 5/2024 | Kapoor | G01R 19/2509 |
| 12,040,770 | B2 | 7/2024 | Leeser et al. | |
| 12,106,947 | B2 * | 10/2024 | Long | H01J 37/32174 |
| 12,136,938 | B2 * | 11/2024 | Juco | H01J 37/32183 |
| 12,283,503 | B2 * | 4/2025 | Ummethala | H10P 72/0606 |
| 2008/0003702 | A1 * | 1/2008 | Cruse | H10P 72/0421 257/E21.525 |
| 2008/0179948 | A1 | 7/2008 | Nagarkatti et al. | |
| 2010/0018648 | A1 | 1/2010 | Collins et al. | |
| 2011/0212625 | A1 | 9/2011 | Toyoda et al. | |
| 2012/0073757 | A1 | 3/2012 | Yamazawa | |
| 2013/0293865 | A1 * | 11/2013 | Ummethala | G03F 7/70716 355/75 |
| 2014/0136048 | A1 * | 5/2014 | Ummethala | G01P 21/00 701/33.1 |
| 2017/0069464 | A1 * | 3/2017 | Ye | H01J 37/32082 |
| 2017/0117118 | A1 * | 4/2017 | Toh | H01J 37/32082 |
| 2017/0117869 | A1 | 4/2017 | Leeser et al. | |
| 2017/0162417 | A1 * | 6/2017 | Ye | H10P 72/722 |
| 2017/0306494 | A1 * | 10/2017 | Lin | H10P 72/0432 |
| 2018/0096823 | A1 * | 4/2018 | Bluck | H01J 37/32568 |
| 2019/0288737 | A1 * | 9/2019 | Hanks | H04B 1/44 |
| 2020/0051787 | A1 | 2/2020 | Shinagawa | |
| 2020/0118856 | A1 * | 4/2020 | Augustyniak | H10P 72/0616 |
| 2021/0249587 | A1 * | 8/2021 | Sun | C23C 14/3492 |
| 2021/0276056 | A1 * | 9/2021 | Prouty | B08B 9/08 |
| 2021/0311114 | A1 * | 10/2021 | Zhang | G01R 31/3177 |
| 2022/0028716 | A1 * | 1/2022 | Ummethala | H10P 72/0606 |
| 2022/0051919 | A1 * | 2/2022 | Augustyniak | H10P 72/0616 |
| 2022/0163707 | A1 * | 5/2022 | Yu | G02B 5/0808 |
| 2022/0163834 | A1 * | 5/2022 | Yu | G02F 1/13394 |
| 2022/0163845 | A1 * | 5/2022 | Yu | G02F 1/136277 |
| 2022/0163846 | A1 * | 5/2022 | Yu | G02F 1/136227 |
| 2022/0165912 | A1 * | 5/2022 | Yu | G02F 1/136 |
| 2022/0223367 | A1 * | 7/2022 | Savandaiah | C23C 14/0063 |
| 2022/0319810 | A1 * | 10/2022 | Vasquez | H03H 7/0153 |
| 2022/0359161 | A1 | 11/2022 | Guo et al. | |
| 2022/0415616 | A1 * | 12/2022 | Juco | H01J 37/32183 |
| 2023/0260802 | A1 * | 8/2023 | Kim | H10P 50/268 438/710 |
| 2023/0264238 | A1 * | 8/2023 | Prouty | B08B 9/08 134/1 |
| 2023/0326720 | A1 * | 10/2023 | Mopidevi | H01J 37/3211 315/111.21 |
| 2024/0055285 | A1 * | 2/2024 | Augustyniak | H10P 72/0616 |
| 2024/0258073 | A1 * | 8/2024 | Juco | H01J 37/32183 |
| 2025/0033156 | A1 * | 1/2025 | Ummethala | B23Q 7/1431 |
| 2025/0038021 | A1 * | 1/2025 | Ummethala | H10P 72/0606 |
| 2025/0136386 | A1 * | 5/2025 | Ummethala | B65G 47/26 |
| 2025/0218829 | A1 * | 7/2025 | Ummethala | H10P 72/0606 |

* cited by examiner

SPLITTER CIRCUIT FOR WAFER PROCESSING SYSTEM

BACKGROUND

Field

Embodiments of the present disclosure generally relate to semiconductor wafer processing systems.

Description of the Related Art

Semiconductor wafer processing systems (e.g., cluster tools) are used in the manufacturing of semiconductor devices on substrates. These systems move or convey wafers between different process chambers. Different processes may be performed on the wafers in the process chambers. For example, different layers or features may be formed on the wafers in the process chambers. To perform certain processes, radio frequency (RF) power may be delivered to the process chambers (e.g., to generate heat in the process chambers).

There are many applications in which it is desirable to be able to divide a high power radio frequency (RF) signal between two loads. RF power supplies used in wafer processing systems often feature advanced voltage and current regulation capabilities to maintain the desired process parameters. The power supplies must provide a highly stable and clean power output, minimizing variations and fluctuations that could adversely affect the quality and consistency of the processed substrates. Furthermore, RF power supplies for wafer processing systems are designed to support specific process requirements. The power supplies may offer programmable voltage and current settings, enabling fine-tuning of process parameters to achieve optimal results. These power supplies often integrate advanced control features and interfaces, allowing seamless integration with other equipment and enabling precise synchronization of power delivery with process steps.

All of these features and considerations make RF power supplies for wafer processing systems very complex and expensive, especially when considering that many of the power supplies remain idle for significant periods of time. Accordingly, there is a need in the art for a more efficient implementation and utilization of power supply resources.

SUMMARY

The present disclosure describes a semiconductor wafer processing system that includes a splitter circuit that splits or divides RF power to different process chambers. According to an embodiment, a wafer processing system includes a first process chamber, a second process chamber, a power supply, a match circuit, and a splitter circuit. The power supply produces an electric current. The match circuit receives the electric current from the power supply and presents an impedance to the power supply. The splitting circuit includes a first leg and a second leg. The first leg includes a first capacitor that directs a first portion of the electric current from the match circuit to the first process chamber. The second leg includes a second capacitor that directs a second portion of the electric current from the match circuit to the second process chamber.

According to another embodiment, a method includes producing, by a power supply, an electric current, receiving, by a match circuit, the electric current from the power supply, and presenting, by the match circuit, an impedance to the power supply. The method also includes directing, by a first leg of a splitting circuit, a first portion of the electric current from the match circuit to a first process chamber. The first leg includes a first capacitor. The method further includes directing by a second leg of the splitting circuit, a second portion of the electric current from the match circuit to a second process chamber. The second leg includes a second capacitor.

According to another embodiment, a wafer processing system includes a match circuit and a splitting circuit. The match circuit receives an electric current from a power supply and presents an impedance to the power supply. The splitting circuit includes a first leg and a second leg. The first leg directs a first portion of the electric current from the match circuit to a first electrode. The second leg directs a second portion of the electric current from the match circuit to a second electrode. The first electrode and the second electrode are positioned within different process chambers.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure describes a semiconductor wafer processing system that uses a splitter circuit to deliver RF power from a power supply to multiple process chambers. In some embodiments, a radio frequency (RF) power supply produces an electrical current and directs the electrical current to a match circuit. In some embodiments, the match circuit includes one or more variable capacitors that can be adjusted to allow the power supply to deliver RF power to an apparent load that has a desired impedance, such as a 50 ohm load, and minimize the amount of reflected RF power. The match circuit directs the electrical current to the splitter circuit. The splitter circuit includes at least one leg per process chamber connected to the splitter circuit. Each leg directs a portion of the electrical current from the match circuit to an electrode or coil disposed in a process chamber. Each leg includes a variable component (e.g., a variable capacitor or inductor) that can be adjusted to adjust the portion of the electrical current directed by that leg to a process chamber.

In certain embodiments, the wafer processing system provides several technical advantages. For example, by using a splitter circuit to feed RF power to different process chambers, the wafer processing system avoids using separate power supplies to generate RF power for different process chambers, which reduces cost, system complexity, and the size and electrical power used by the wafer processing system. As another example, the splitter circuit allows the RF power directed to each process chamber to be adjustable. As a result, the splitter circuit may provide RF power for different processes and different types of wafers.

Figure 1:
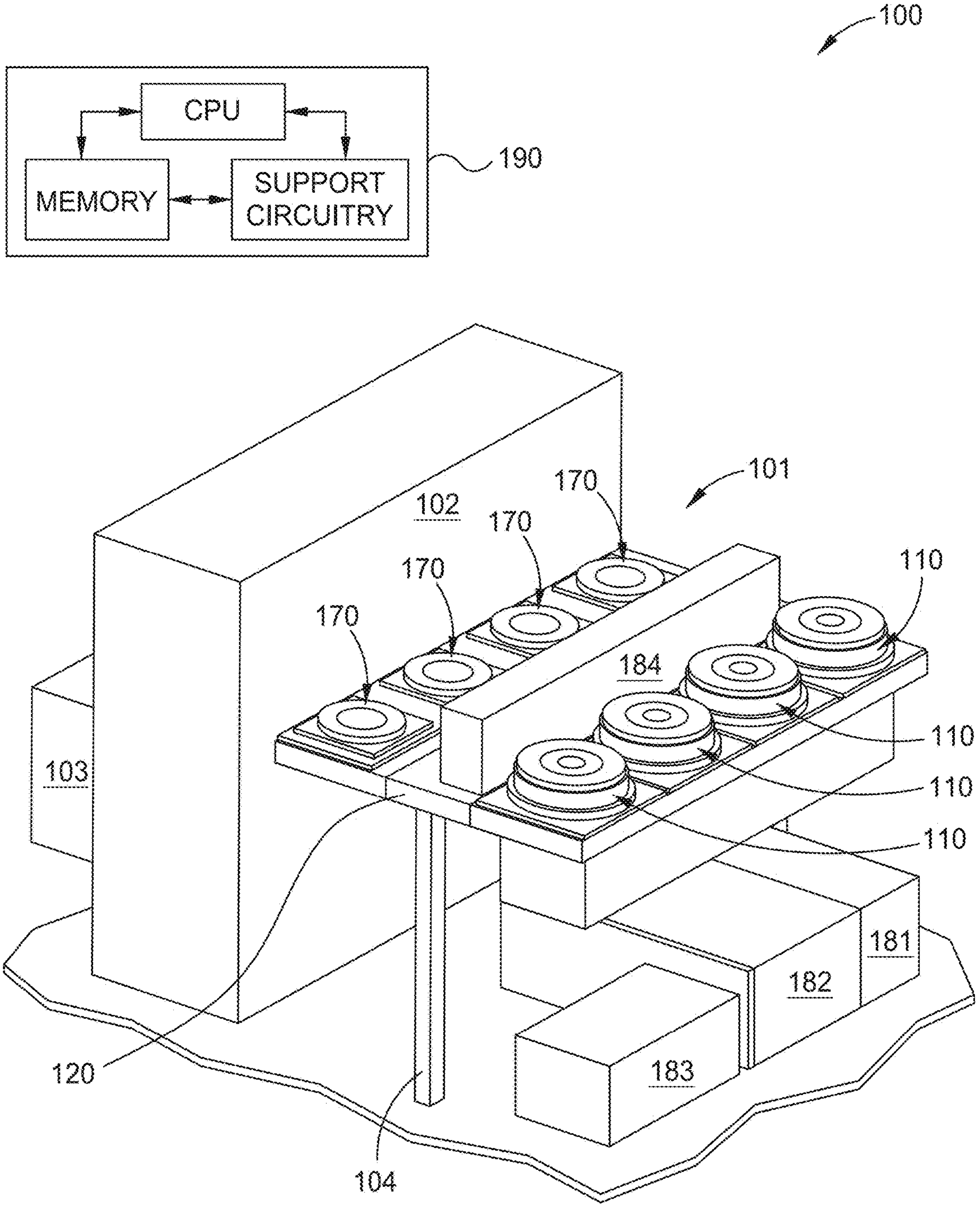
FIG. 1 illustrates an example wafer processing system.

FIG. 1 illustrates an example wafer processing system 100. The system 100 includes a factory interface 102 and at least one processing mainframe 101.

The processing mainframe 101 includes multiple process chambers 110, a swapper assembly 120, multiple load locks 170, and a controller 190. The processing mainframe 101 may include any number of process chambers 110 and load locks 170. For example, the processing mainframe 101 may include two, three, four, and/or more than four process chambers 110 and load locks 170. The load locks 170 and process chambers 110 can be grouped in pairs, with each grouping having one load lock 170 opposing a corresponding process chamber 110. The swapper assembly 120 is located between the process chambers 110 and the load locks 170. The swapper assembly 120 includes a swapper for each pair of the process chambers 110 and load locks 170, and each swapper is used to move substrates or wafers between the corresponding process chamber 110 and load lock 170. The processing mainframe 101 may be structurally supported in a position relative to the factory interface 102 by one or more supports 104 (e.g., frames). For example, the supports 104 may support the weight of the processing mainframe 101.

As shown in FIG. 1, the processing mainframe 101 includes four pairs of process chambers 110 and load locks 170. In some embodiments, the processing mainframe 101 may have only one process chamber 110 and load lock 170. In some embodiments, the processing mainframe 101 may have two or three process chambers 110 and load locks 170. In some embodiments, the processing mainframe 101 may have more than four process chambers 110 and load locks 170.

The process chambers 110 include a substrate support (e.g., pedestal, platen) and a processing kit and source assembly that process a wafer within the process chambers 110. The process chambers 110 may perform any number of processes such as preclean, chemical vapor deposition (CVD), plasma enhanced chemical vapor deposition (PECVD), physical vapor deposition (PVD), atomic layer deposition (ALD), decoupled plasma nitridation (DPN), rapid thermal processing (RTP), ashing, annealing, and etching, or any process utilized in electronic device fabrication. In one embodiment, the processing sequence is adapted to form a high-K capacitor structure, where process chambers 110 may be a DPN chamber, a CVD chamber capable of depositing poly-silicon, and/or a MCVD chamber capable of depositing titanium, tungsten, tantalum, platinum, or ruthenium.

The factory interface 102 may be coupled to one or more front opening unified pods (FOUPs) 103. FOUPs 103 may each be a container having a stationary cassette therein for holding multiple wafers. FOUPs 103 may each have a front opening interface configured to be used with factory interface 102. Factory interface 102 may have a buffer chamber (not shown) and one or more robot assemblies to transfer wafers via linear, rotational, and/or vertical movement between FOUPs 103 and the load locks 170. The factory interface 102 may include a set of FOUPs 103 and corresponding one or more robot assemblies for each processing mainframe 101.

In some embodiments, the process chambers 110 are part of a monolithic structure (e.g., mainframe), such as sharing a common housing. In some embodiments, the swapper assembly 120 and the load locks 170 may each be part of a separate monolithic structure. Thus, in this case, the processing mainframe 101 may be formed by connecting a monolithic structure including the process chambers 110 to one side of the monolithic structure of the swapper assembly 120 and then also connecting a monolithic structure including the load locks 170 to the other side of the monolithic structure including the swapper assembly 120. Assembling the system 100 from monolithic structures, each including multiple components, such as process chambers 110, load locks 170, or swapper assembly 120, decreases manufacturing and assembly costs and reduces the number of leak points. In some other embodiments, the process chambers 110, the swapper assembly 120 and the load locks 170 may each be part of a single monolithic structure that is used to support and provide a positional reference for the mounting and aligning of the various components to each other and to the monolithic structure.

The system 100 may also include a pumping system 181, a gas panel 182, a power supply 183, and an electronics module 184. The pumping system 181, gas panel 182, and power supply 183 are shown disposed underneath the processing mainframe 101. The pumping system 181 creates and/or maintains a pressure within each process chamber 110. For example, the pumping system 181 may include a vacuum pump that evacuates the process chambers 110. The gas panel 182 may supply one or more gases used to process a wafer in a process chamber 110. The power supply 183 may be a power source (e.g., an AC power source or a DC power source) that powers electrical equipment of the system 100, such as operating equipment in the process chambers 110 (e.g., the source assemblies). The power supply 183 may also include an RF power supply that supplies RF power to the process chambers 110 (e.g., to power a shower head or an electrostatic chuck). The electronics module 184 may include electronics used to monitor and control the system 100. The electronics module 184 may be in communication with the controller 190.

The pumping system 181 may create and maintain a pressure within the load locks 170 (e.g., evacuating each load lock 170). The pumping system 181 may also create and maintain a pressure within the swapper assembly 120 (e.g., evacuating the swapper assembly 120). The system 100 may include a separate pumping system 181 for each of the process chambers 110, the swapper assembly 120, and the load locks 170.

In some embodiments of the system 100, the process chambers 110 are isolated from each other, and thus do not share resources other than a power delivery circuit, which will be discussed further below. However, in some other embodiments, the process chambers 110 are partially isolated from each other, and in this case, may additionally share some resources other than a power delivery circuit. In one example, the process chambers 110 share the pumping system 181 and the gas panel 182.

The controller 190 may include a programmable central processing unit (CPU) which is operable with a memory (e.g., non-transitory computer readable medium and/or non-volatile memory) and support circuits. The support circuits are coupled to the CPU and includes cache, clock circuits, input/output subsystems, power supplies, and the like, and combinations thereof coupled to the various components of the system 100, to facilitate control of the system 100. For example, in one or more embodiments the CPU is one of any form of general purpose computer processor used in an industrial setting, such as a programmable logic controller (PLC), for controlling the RF power directed to different process chambers 110. The memory, coupled to the CPU, is non-transitory and is one or more of readily available memory such as random access memory (RAM), read only memory (ROM), floppy disk drive, hard disk, or any other form of digital storage, local or remote.

The CPU is any electronic circuitry, including, but not limited to one or a combination of microprocessors, microcontrollers, application specific integrated circuits (ASIC), application specific instruction set processor (ASIP), and/or state machines, that communicatively couples to the memory and controls the operation of the system 100. The CPU may be 8-bit, 16-bit, 32-bit, 64-bit or of any other suitable architecture. The CPU may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The CPU may include other hardware that operates software to control and process information. The CPU executes software stored on the memory to perform any of the functions described herein. The CPU is not limited to a single processing device and may encompass multiple processing devices contained in the same device or computer or distributed across multiple devices or computers. The CPU is considered to perform a set of functions or actions if the multiple processing devices collectively perform the set of functions or actions, even if different processing devices perform different functions or actions in the set.

The memory may store, either permanently or temporarily, data, operational software, or other information for the CPU. The memory may include any one or a combination of volatile or non-volatile local or remote devices suitable for storing information. For example, the memory may include random access memory (RAM), read only memory (ROM), magnetic storage devices, optical storage devices, or any other suitable information storage device or a combination of these devices. The software represents any suitable set of instructions, logic, or code embodied in a computer-readable storage medium. For example, the software may be embodied in the memory, a disk, a CD, or a flash drive. In particular embodiments, the software may include an application executable by the CPU to perform one or more of the functions described herein. The memory is not limited to a single memory and may encompass multiple memories contained in the same device or computer or distributed across multiple devices or computers. The memory is considered to store a set of data, operational software, or information if the multiple memories collectively store the set of data, operational software, or information, even if different memories store different portions of the data, operational software, or information in the set.

Figure 2:
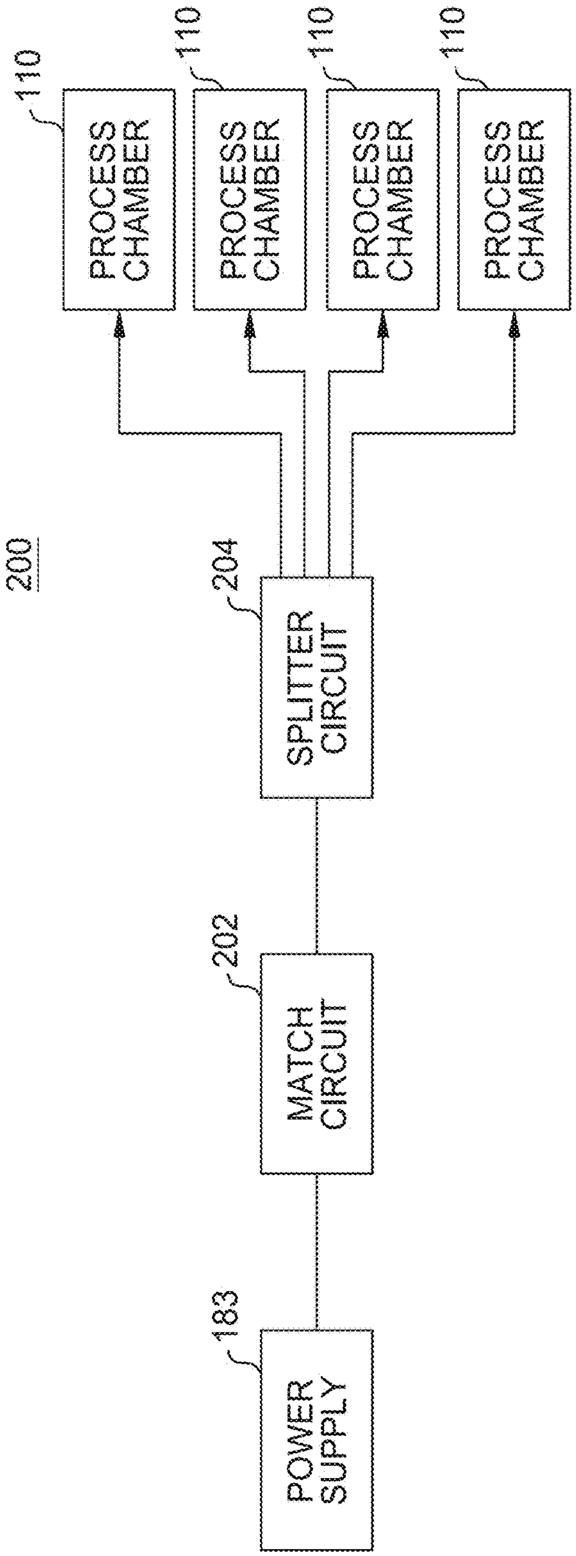
FIG. 2 illustrates an example power delivery circuit of the wafer processing system of FIG. 1, according to one or more embodiments of the disclosure.

FIG. 2 illustrates an example power delivery circuit 200 of the wafer processing system 100 of FIG. 1. As seen in FIG. 2, the power delivery circuit 200 includes the power supply 183, a match circuit 202, and a splitter circuit 204. Generally, the power delivery circuit 200 produces RF power and directs that RF power to multiple process chambers 110 of the system 100.

The power supply 183 generates an electrical current and directs that electrical current to the match circuit 202. The electrical current may be an RF electrical current. In this manner, the power supply 183 produces RF power for the process chambers 110 of the system 100. The power supply 183 directs the electrical current to the match circuit 202.

The match circuit 202 may present an impedance to the power supply 183. The match circuit 202 includes at least one variable electrical component (e.g., a variable capacitor) that is adjusted (e.g., using control signals from the controller 190) to adjust the impedance that the match circuit 202 presents to the power supply 183. For example, by adjusting a capacitance of a variable capacitor in the match circuit 202, the impedance (e.g., 50Ω) presented by the match circuit 202 to the power supply 183 changes. In some embodiments, the impedance presented by the match circuit 202 may be selected to improve power transfer or to reduce signal reflection (e.g., of the RF current from the power supply 183). The match circuit 202 receives the electrical current from the power supply 183 and directs the electrical current to the splitter circuit 204.

The splitter circuit 204 directs portions of the electrical current from the match circuit 202 to different process chambers 110 of the system 100. The splitter circuit 204 includes legs with variable electrical components (e.g., variable capacitors and/or inductors). These legs direct portions of the electrical current to the different process chambers 110. The amount of electrical current directed by a leg to a process chamber 110 may be adjusted by adjusting these variable electrical components (e.g., using control signals from the controller 190).

In some embodiments, the power delivery circuit 200 includes voltage and/or current sensors. For example, one or more legs of the splitter circuit 204 may include a sensor that detects the electrical current directed by the legs to process chambers 110. The controller 190 may use the information from the sensors to determine how to adjust the variable electrical components in one or more of the legs of the splitter circuit 204.

Figure 3:
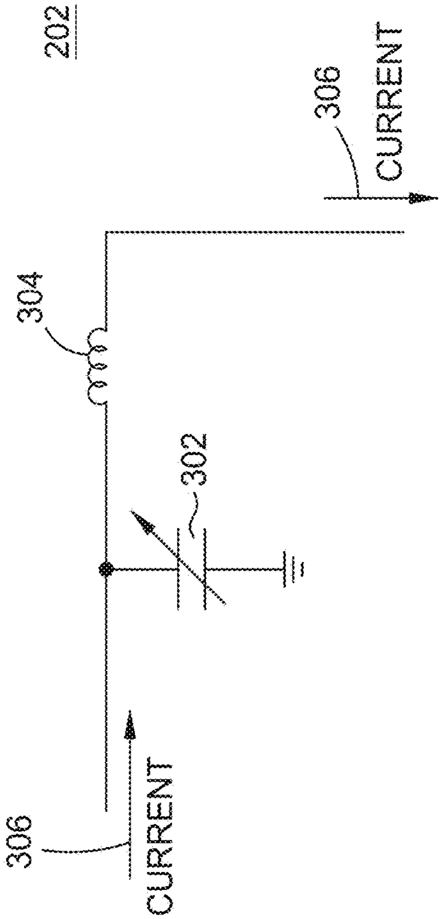
FIG. 3 illustrates an example match circuit of the power delivery circuit of FIG. 2, according to one or more embodiments of the disclosure.

FIG. 3 illustrates an example match circuit 202 (e.g., L-type match) of the power delivery circuit 200 of FIG. 2. As seen in FIG. 3, the match circuit 202 includes a capacitor 302 and an inductor 304. Generally, the match circuit 202 presents an impedance to the power supply 183. Additionally, the match circuit 202 directs an electrical current 306 from the power supply 183 to the splitter circuit 204.

In the example of FIG. 3, the capacitor 302 and the inductor 304 are connected in parallel to an input of the match circuit 202. The capacitor 302 is connected to ground, and the inductor 304 is connected to an output of the match circuit 202, which is coupled to the splitter circuit 204 and the loads formed in the process chambers. The capacitor 302 may be a variable capacitor. A capacitance of the capacitor

302 may be adjusted to vary the impedance presented by the match circuit 202 to the power supply 183. In some embodiments, a control signal from the controller 190 adjusts or controls the capacitance of the capacitor 302. By adjusting the impedance presented to the power supply 183, the match circuit 202 may improve power transfer from the power supply 183 and/or reduce reflections. In some embodiments, the match circuit 202 can also include a second variable capacitor (not shown) that is connected between a node positioned on the opposite end of the inductor 304 as the capacitor 302 is positioned and ground (e.g., pi-type match) and/or a third variable capacitor that is positioned in series with inductor 304.

In general, the loads described herein include complex loads that are formed by generating a plasma in a processing region of the process chambers 110. In one example, the load may include the plasma formed in a processing chamber 110, a cathode sheath formed over an electrode in the process chamber, cathode (e.g., electrode) and power delivery system (e.g., transmission line(s)) as well as stray inductive and capacitive elements found within the process chamber 110.

Although the match circuit 202 is shown as receiving the electrical current 306 from the power supply 183 and directing the electrical current 306 to the splitter circuit 204, it is understood that the match circuit 202 may alter or change the electrical current 306 as the electrical current 306 passes through the match circuit 202. Even though the match circuit 202 may alter or change the electrical current 306, the match circuit 202 is still considered as directing the electrical current 306 received from the power supply 183 to the splitter circuit 204.

FIGS. 4 through 7 illustrate different embodiments of the splitter circuit 204. Each splitter circuit 204 may include different electrical components that direct portions of the electrical current 306 to process chambers 110.

Figure 4:
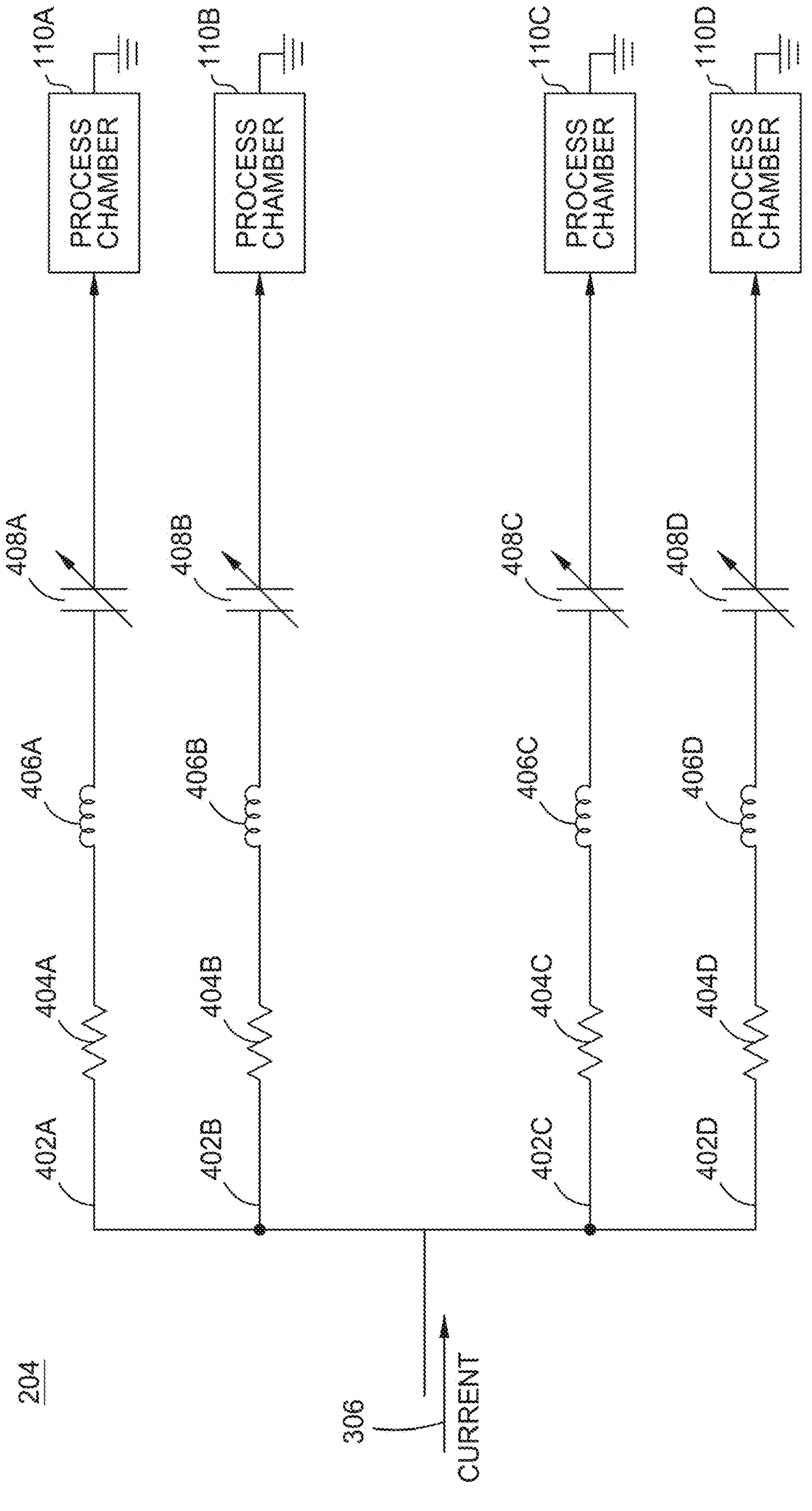
FIG. 4 illustrates an example splitter circuit of the power delivery circuit of FIG. 2, according to one or more embodiments of the disclosure.

FIG. 4 illustrates an example splitter circuit 204 of the power delivery circuit 200 of FIG. 2. Generally, the splitter circuit 204 receives the electrical current 306 from the match circuit 202 and power supply 183 and directs portions of the electrical current 306 to different process chambers 110 of the system 100.

The splitter circuit 204 includes multiple legs 402. In the example of FIG. 4, the splitter circuit 204 includes the legs 402A, 402B, 402C, and 402D. The splitter circuit 204 may include any number of legs 402 depending on the number of process chambers 110 connected to the splitter circuit 204. Generally, each leg 402 is connected to an electrode or coil disposed within the process chamber 110. Each leg 402 directs a portion of the electrical current 306 from the match circuit 202 to the electrode or coil in a process chamber 110, the load formed in the process chamber and ground.

In the example of FIG. 4, each leg 402 includes a resistor 404, an inductor 406, and a capacitor 408 connected in series with each other. These electrical components are also connected in series with a process chamber 110 and ground. The leg 402A includes the resistor 404A, the inductor 406A, and the capacitor 408A. The leg 402A is connected in series with the process chamber 110A and ground. The leg 402B includes the resistor 404B, the inductor 406B, and the capacitor 408B. The leg 402B is connected in series with the process chamber 110B and ground. The leg 402C includes the resistor 404C, the inductor 406C, and the capacitor 408C. The leg 402C is connected in series with the process chamber 110C and ground. The leg 402D includes the resistor 404D, the inductor 406D, and the capacitor 408D. The leg 402C is connected in series with the process chamber 110D and ground. In one embodiment, the capacitors 408A, 408B, 408C, and 408D are variable capacitors. The capacitance of the capacitors 408A, 408B, 408C, and 408D may be adjusted (e.g., using control signals from the controller 190) to adjust the portions of the electrical current 306 carried by each of the legs 402A, 402B, 402C, and 402D to their respective process chambers 110. In this manner, the same or different amounts of RF power may be simultaneously delivered to different process chambers, and the amount of RF power delivered to each process chamber 110 may be controlled and adjusted. In some embodiments, it is desirable for the processing characteristics of the processes simultaneously performed in each process chamber 110A, 110B, 110C, and 110D to be substantially the same to assure that the wafer processing results achieved on each wafer processed in each process chamber 110A, 110B, 110C, and 110D are substantially the same. In one example, the processing characteristics can include controlling the amount of RF current and/or reflected power provided in each leg 402A, 402B, 402C and 402D to be substantially the same.

Figure 5:
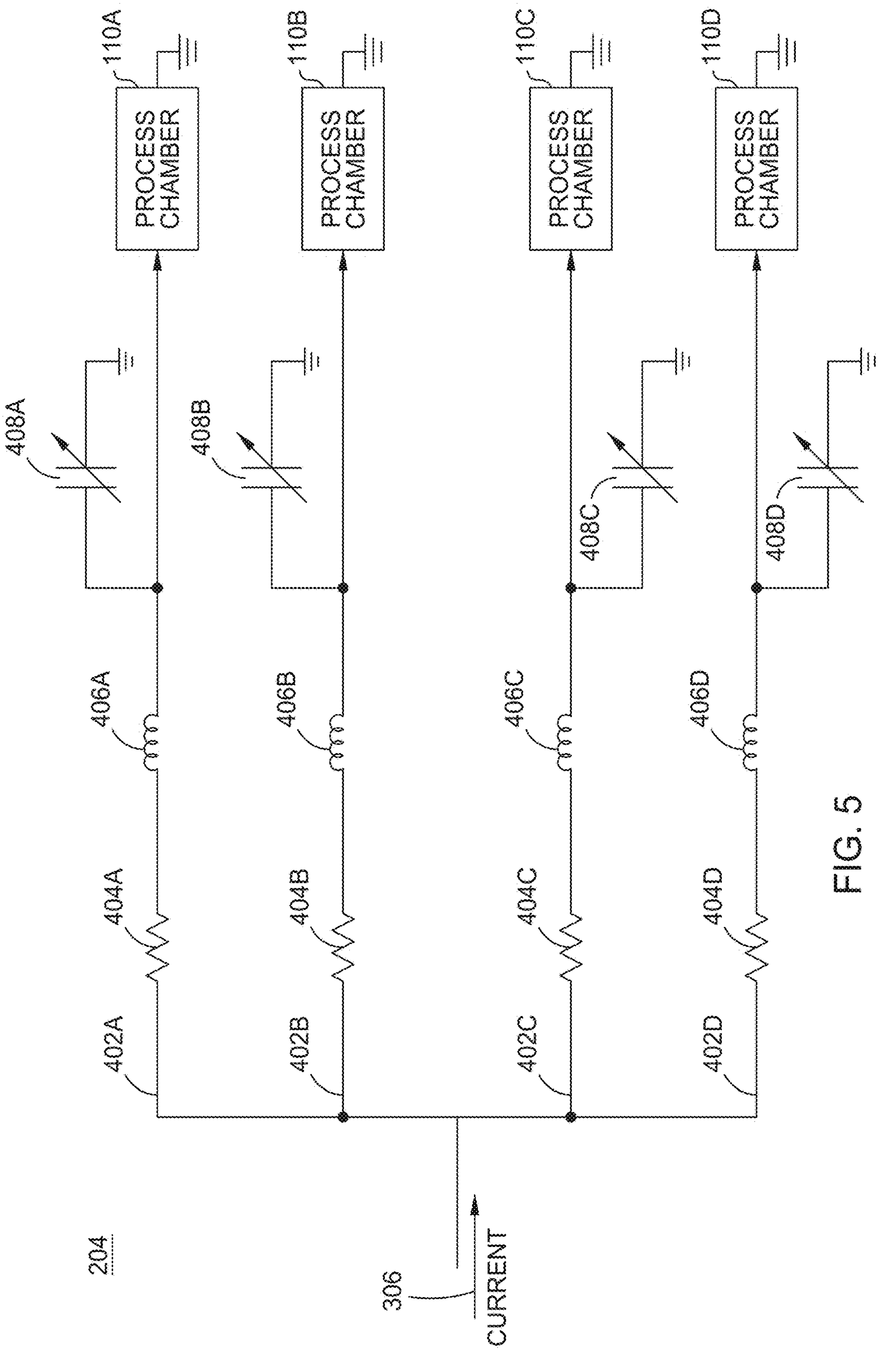
FIG. 5 illustrates an example splitter circuit of the power delivery circuit of FIG. 2, according to one or more embodiments of the disclosure.

FIG. 5 illustrates an example splitter circuit 204 of the power delivery circuit 200 of FIG. 2. Generally, the splitter circuit 204 receives the electrical current 306 from the match circuit 202 and directs portions of the electrical current 306 to different process chambers 110 of the system 100.

Similar to prior examples, the splitter circuit 204 in FIG. 5 includes the legs 402A, 402B, 402C, and 402D connected in series with the process chambers 110A, 110B, 110C, 110D and ground. The splitter circuit 204 may include any number of legs 402 depending on the number of process chambers 110 connected to the splitter circuit 204. Generally, each leg 402 is connected to the load formed in a process chamber 110 and ground. Each leg 402 directs a portion of the electrical current 306 from the match circuit 202 to a process chamber 110 and ground.

In the example of FIG. 5, each leg 402 includes a resistor 404, an inductor 406, and a capacitor 408. The leg 402A includes the resistor 404A, the inductor 406A, and the capacitor 408A. The leg 402B includes the resistor 404B, the inductor 406B, and the capacitor 408B. The leg 402C includes the resistor 404C, the inductor 406C, and the capacitor 408C. The leg 402D includes the resistor 404D, the inductor 406D, and the capacitor 408D. The capacitors 408A, 408B, 408C, and 408D are variable capacitors. The capacitance of the capacitors 408A, 408B, 408C, and 408D may be adjusted (e.g., using control signals from the controller 190) to adjust the portions of the electrical current 306 carried by each of the legs 402A, 402B, 402C, and 402D to the load formed in their respective process chambers 110. In this manner, the same or different amounts of RF power may be simultaneously delivered to different process chambers, and the amount of RF power delivered to each process chamber 110 may be controlled and adjusted. As noted above, in some embodiments, it is desirable for the processing characteristics of the processes simultaneously performed in each process chamber 110A, 110B, 110C, and 110D to be substantially the same to assure that the wafer processing results achieved on each wafer processed in each process chamber 110A, 110B, 110C, and 110D are substantially the same.

The resistor 404 and inductor 406 in each leg 402 are connected in series with each other. The capacitor 408 and the process chamber 110 in each leg 402 are connected to the inductor 406 and parallel with each other. As a result, each capacitor 408 is connected in parallel with a process chamber 110.

Figure 6:
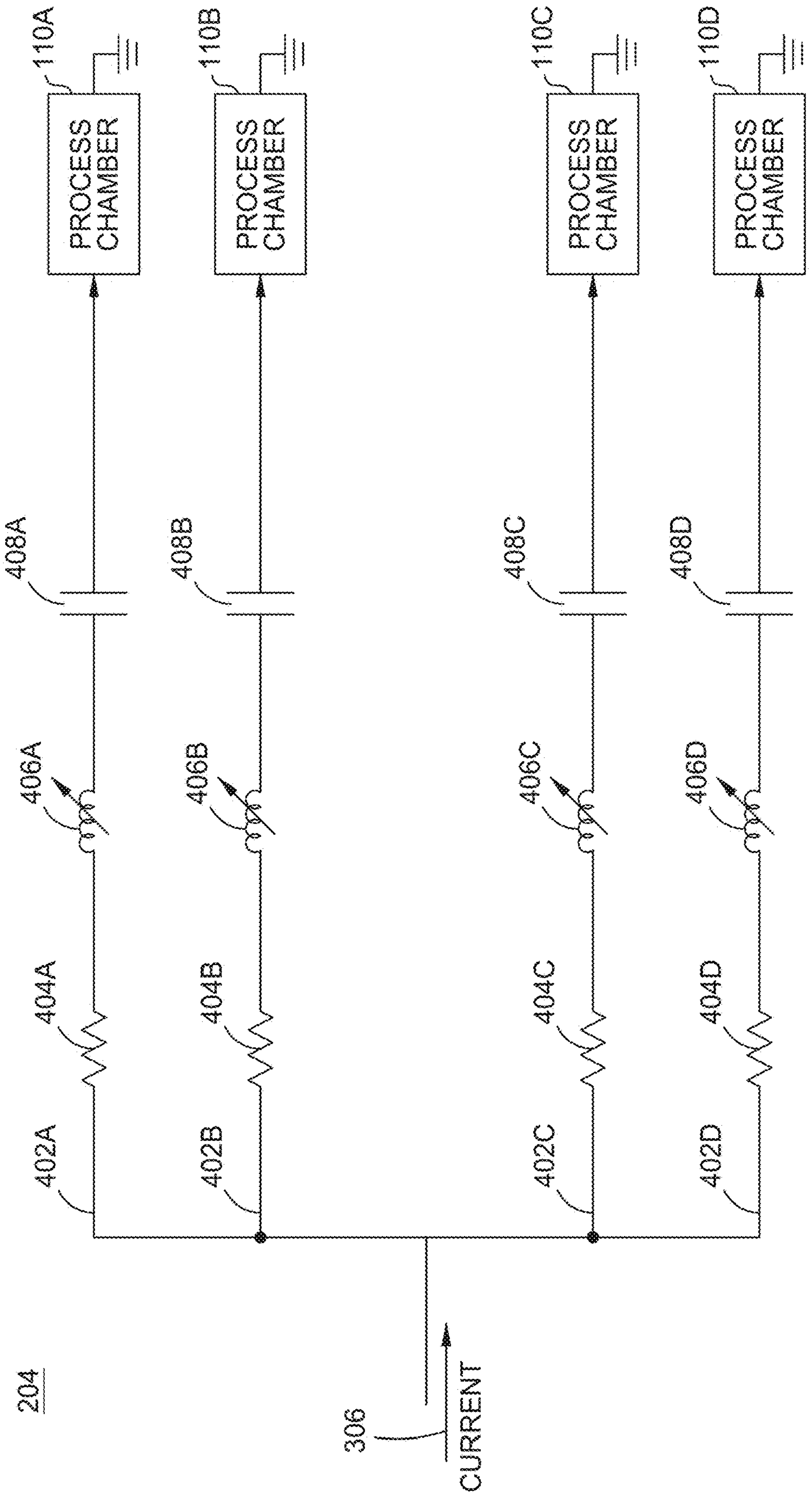
FIG. 6 illustrates an example splitter circuit of the power delivery circuit of FIG. 2, according to one or more embodiments of the disclosure.

FIG. 6 illustrates an example splitter circuit 204 of the power delivery circuit 200 of FIG. 2. Generally, the splitter circuit 204 receives the electrical current 306 from the match circuit 202 and directs portions of the electrical current 306 to different process chambers 110 of the system 100.

Similar to prior examples, the splitter circuit 204 in FIG. 6 includes the legs 402A, 402B, 402C, and 402D connected in series with the process chambers 110A, 110B, 110C, 110D and ground. The splitter circuit 204 may include any number of legs 402 depending on the number of process chambers 110 connected to the splitter circuit 204. Generally, each leg 402 is connected to a process chamber 110. Each leg 402 directs a portion of the electrical current 306 from the match circuit 202 to a process chamber 110.

In the example of FIG. 6, each leg 402 includes a resistor 404, an inductor 406, and a capacitor 408 connected in series with each other. These electrical components are also connected in series with a process chamber 110 and ground. The leg 402A includes the resistor 404A, the inductor 406A, and the capacitor 408A. The leg 402B includes the resistor 404B, the inductor 406B, and the capacitor 408B. The leg 402C includes the resistor 404C, the inductor 406C, and the capacitor 408C. The leg 402D includes the resistor 404D, the inductor 406D, and the capacitor 408D. The inductors 406A, 406B, 406C, and 406D are variable inductors. The inductances of the inductors 406A, 406B, 406C, and 406D may be adjusted (e.g., using control signals from the controller 190) to adjust the portions of the electrical current 306 carried by each of the legs 402A, 402B, 402C, and 402D to their respective process chambers 110. In this manner, the same or different amounts of RF power may be simultaneously delivered to the different process chambers 110A, 110B, 110C, and 110D, and the amount of RF power delivered to each process chamber 110 may be controlled and adjusted. As noted above, in some embodiments, it is desirable for the processing characteristics of the processes simultaneously performed in each process chamber 110A, 110B, 110C, and 110D to be substantially the same to assure that the wafer processing results achieved on each wafer processed in each process chamber 110A, 110B, 110C, and 110D are substantially the same.

Figure 7:
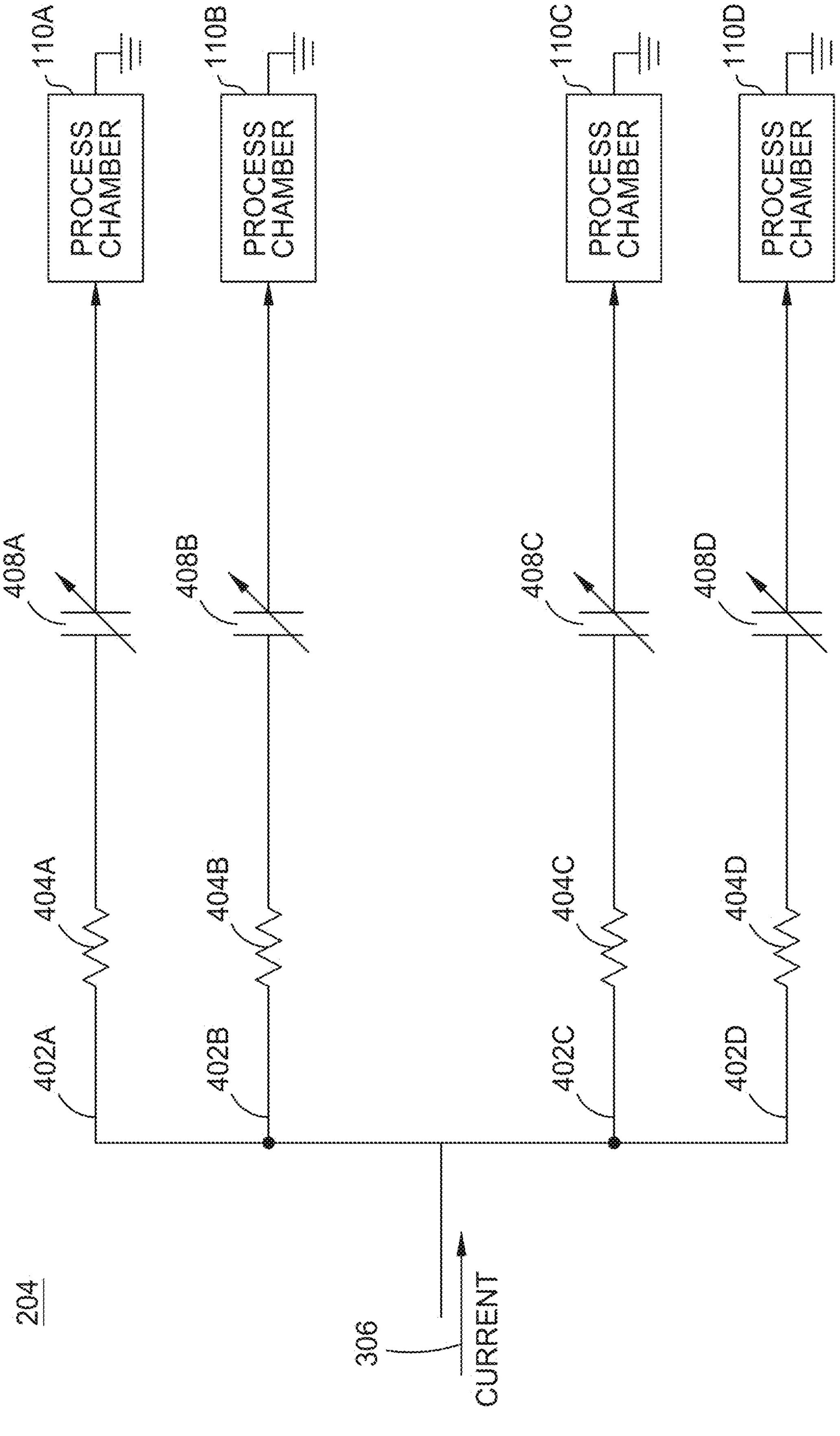
FIG. 7 illustrates an example splitter circuit of the power delivery circuit of FIG. 2, according to one or more embodiments of the disclosure.

FIG. 7 illustrates an example splitter circuit 204 of the power delivery circuit 200 of FIG. 2. Generally, the splitter circuit 204 receives the electrical current 306 from the match circuit 202 and directs portions of the electrical current 306 to different process chambers 110 of the system 100.

Similar to prior examples, the splitter circuit 204 in FIG. 7 includes the legs 402A, 402B, 402C, and 402D connected in series with the process chambers 110A, 110B, 110C, 110D and ground. The splitter circuit 204 may include any number of legs 402 depending on the number of process chambers 110 connected to the splitter circuit 204. Generally, each leg 402 is connected to a process chamber 110. Each leg 402 directs a portion of the electrical current 306 from the match circuit 202 to a process chamber 110.

In the example of FIG. 7, each leg 402 includes a resistor 404 and a capacitor 408 connected in series with each other. These electrical components are also connected in series with a process chamber 110. The leg 402A includes the resistor 404A and the capacitor 408A. The leg 402B includes the resistor 404B and the capacitor 408B. The leg 402C includes the resistor 404C and the capacitor 408C. The leg 402D includes the resistor 404D and the capacitor 408D. The capacitors 408A, 408B, 408C, and 408D are variable capacitors. The capacitance of the capacitors 408A, 408B, 408C, and 408D may be adjusted (e.g., using control signals from the controller 190) to adjust the portions of the electrical current 306 carried by each of the legs 402A, 402B, 402C, and 402D to their respective process chambers 110. In this manner, similar or different amounts of RF power may be simultaneously delivered to different process chambers, and the amount of RF power delivered to each process chamber 110 may be controlled and adjusted. As noted above, in some embodiments, it is desirable for the processing characteristics of the processes simultaneously performed in each process chamber 110A, 110B, 110C, and 110D to be substantially the same to assure that the wafer processing results achieved on each wafer processed in each process chamber 110A, 110B, 110C, and 110D are substantially the same.

In some embodiments, although the legs 402A, 402B, 402C, and 402D do not include inductors, the legs 402A, 402B, 402C, and 402D may still provide an inductance. For example, the wires, traces, or conductors connecting the resistor 404, capacitor 408, and process chamber 110 in each leg may provide an inductance.

Although the examples of FIGS. 2 through 7 show the match circuit 202 and the splitter circuit 204 as distinct circuits, the functions performed by the match circuit 202 may use or rely on some of the components of the splitter circuit 204, and vice versa. For example, the impedance presented to the power supply 183 may depend on the capacitance of the capacitor 302 along with the series reactance provided by the inductor 304 in the match circuit 202 and the inductors 406 and the capacitors 408 in the splitter circuit 204. As a result, the capacitors 408 and/or the inductors 406 in the splitter circuit 204 may adjust the electric current directed to the process chambers 110, and the capacitors 408 and/or the inductors 406 may adjust the impedance presented to the power supply 183. In some embodiments, a variable vacuum capacitor is connected in series with the inductor 304 between the match circuit 202 and the splitter circuit 204. The variable vacuum capacitor separates the match circuit 202 and the splitter circuit 204 such that their functions operate more independently. For example, changes to the impedance presented to the power supply 183 that are caused by the splitter variable capacitor movements can be compensated by this additional variable vacuum capacitor.

Additionally or alternatively, although the examples of FIGS. 2 through 7 show the splitter circuit 204 including the resistors 404 in each leg 402 of the splitter circuit 204, it is understood that the splitter circuit 204 may not include one or more of these resistors 404. As a result, the splitter circuit 204 may not include a resistor 404 in one or more legs 402 of the splitter circuit 204.

Figure 8:
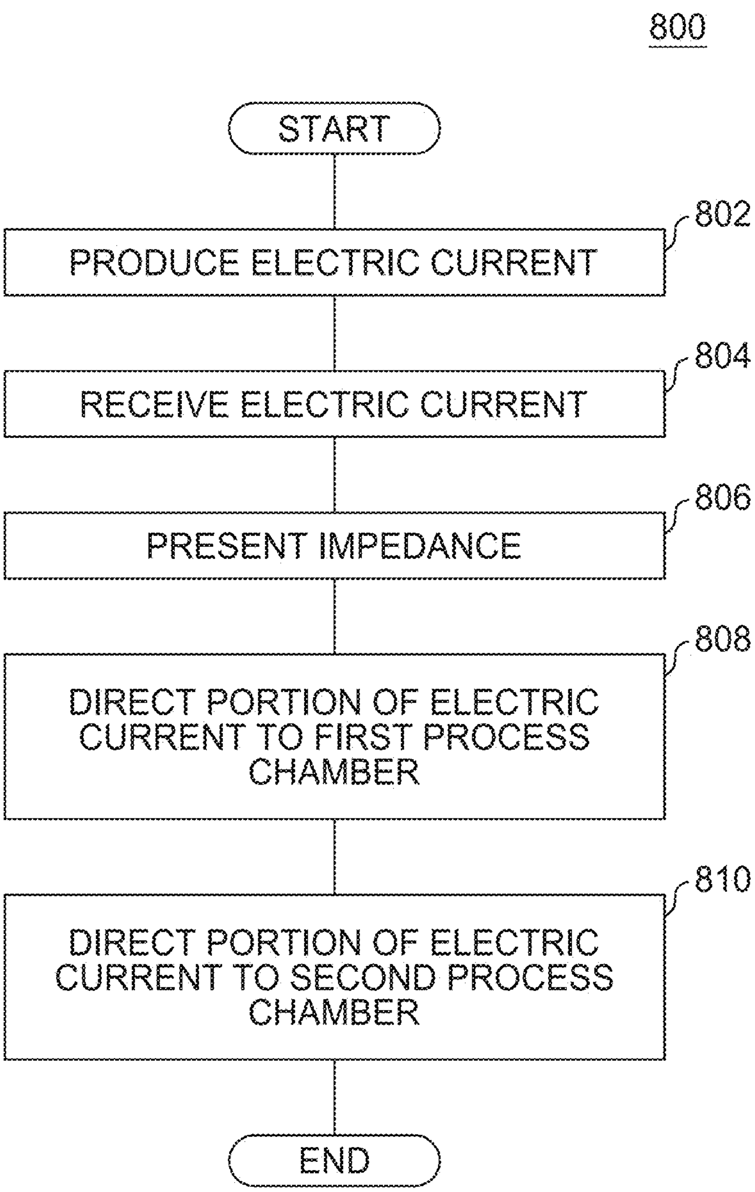
FIG. 8 is a flowchart of an example method performed by the wafer processing system of FIG. 1, according to one or more embodiments of the disclosure.

FIG. 8 is a flowchart of an example method 800 performed by the wafer processing system 100 of FIG. 1. In particular embodiments, by performing the method 800, the system 100 directs RF power to multiple process chambers 110.

In block 802, the system 100 produces an electrical current 306. The system 100 includes a power supply 183 that produces the electrical current 306. The electrical current 306 may be an RF current that delivers RF power. The power supply 183 directs the electrical current 306 to the match circuit 202. In block 804, the match circuit 202 receives the electrical current 306 from the power supply 183. The match circuit 202 directs the electrical current 306 to the splitter circuit 204. The match circuit 202 is considered to direct the electrical current 306 to the splitter circuit 204 even though the match circuit 202 may alter or change the electrical current 306 while the electrical current 306 passes through the match circuit 202.

In block 806, the match circuit 202 presents an impedance to the power supply 183. The match circuit 202 may include a capacitor 302 and an inductor 304 connected in parallel to an input of the match circuit 202. The capacitor 302 may be connected to ground, and the inductor 304 may be connected to an output of the match circuit 202. The capacitor 302 may be a variable capacitor. The impedance that the match circuit 202 presents to the power supply 183 may be adjusted by adjusting the capacitance of the capacitor 302. In some embodiments, the capacitance of the capacitor 302 is adjusted using a control signal from the controller 190. By changing the impedance presented to the power supply 183, the match circuit 202 may improve power transfer and/or reduce reflections.

The splitter circuit 204 receives the electrical current 306 from the match circuit 202. The splitter circuit 204 includes legs 402 that direct portions of the electrical current 306 to different process chambers 110 to deliver RF power to those process chambers 110. Each leg 402 includes a variable electrical component that can be adjusted to change the portion of the electrical current 306 carried by that leg 402 to its respective process chamber 110. In block 808, a leg 402A directs a portion of the electrical current 306 to a first process chamber 110. In block 810, a leg 402B directs a portion of the electrical current 306 to a second process chamber 110 different from the first process chamber 110. The portions of the electrical current 306 directed by the legs 402A and 402B may be the same or different. In this manner, the splitter circuit 204 delivers the same or different amounts of RF power to different process chambers 110.

There may be several different arrangements for a leg 402 of the splitter circuit 204. In one example arrangement, the leg 402 includes a resistor 404, an inductor 406, and a capacitor 408 connected in series. The capacitor 408 is a variable capacitor, and the capacitor 408 is connected in series with a process chamber 110 and ground. The capacitance of the capacitor 408 may be adjusted to change the portion of the electrical current 306 directed by the leg 402 to the process chamber 110.

In another example arrangement, the leg 402 includes a resistor 404 and an inductor 406 connected in series. The leg 402 also includes a capacitor 408 that is connected in parallel with the process chamber 110 to the inductor 406. The capacitor 408 is also connected to ground. The capacitor 408 is a variable capacitor. The capacitance of the capacitor 408 may be adjusted to change the portion of the electrical current 306 directed by the leg 402 to the process chamber 110 and ground.

In another example arrangement, the leg 402 includes a resistor 404, an inductor 406, and a capacitor 408 connected in series. The capacitor 408 is connected in series with a process chamber 110. The inductor 406 is a variable inductor, and the inductance of the inductor 406 may be adjusted to change the portion of the electrical current 306 directed by the leg 402 to the process chamber 110 and ground.

In another example arrangement, the leg 402 includes a resistor 404 and a capacitor 408 connected in series. The capacitor 408 is a variable capacitor, and the capacitor 408 is connected in series with a process chamber 110. The capacitance of the capacitor 408 may be adjusted to change the portion of the electrical current 306 directed by the leg 402 to the process chamber 110. In this example, an inductance may be provided by the conductors connecting the resistor 404, capacitor 408, and/or process chamber 110 and ground.

In summary, the semiconductor wafer processing system 100 uses a splitter circuit 204 to delivery RF power from a power supply 183 to multiple process chambers 110. The power supply 183 produces an electrical current 306 and directs the electrical current 306 to a match circuit 202. The match circuit 202 has a variable capacitor 302 that is adjusted to present a particular impedance to the power supply 183. The match circuit 202 directs the electrical current 306 to the splitter circuit 204. The splitter circuit 204 includes a leg 402 per process chamber 110 connected to the splitter circuit 204. Each leg 402 directs a portion of the electrical current 306 from the match circuit 202 to a process chamber 110. Each leg 402 includes a variable component (e.g., a variable capacitor or inductor) that can be adjusted to adjust the portion of the electrical current 306 directed by that leg 402 to a process chamber 110.

While the foregoing is directed to embodiments of the present disclosure, other and further embodiments of the disclosure may be devised without departing from the basic scope thereof, and the scope thereof is determined by the claims that follow.

What is claimed is:

1. A wafer processing system comprising:
a first process chamber;
a second process chamber;
a power supply arranged to produce an electric current;
a match circuit arranged to receive the electric current from the power supply and to present an impedance to the power supply; and
a splitter circuit comprising:
a first leg comprising a first capacitor, wherein the first leg is arranged to direct a first portion of the electric current from the match circuit to the first process chamber; and
a second leg comprising a second capacitor, wherein the second leg is arranged to direct a second portion of the electric current from the match circuit to the second process chamber.

2. The wafer processing system of claim 1, wherein the first process chamber is connected in series with the first capacitor.

3. The wafer processing system of claim 1, wherein the first process chamber is connected in parallel with the first capacitor.

4. The wafer processing system of claim 1, wherein the first capacitor is a variable capacitor, and wherein adjusting a capacitance of the first capacitor adjusts the first portion of the electric current.

5. The wafer processing system of claim 1, wherein the first leg further comprises a first inductor connected in series with the first capacitor.

6. The wafer processing system of claim 5, wherein the first inductor is a variable inductor, and wherein adjusting an inductance of the first inductor adjusts the first portion of the electric current.

7. The wafer processing system of claim 1, wherein the first leg further comprises a first resistor connected in series with the first capacitor.

8. The wafer processing system of claim 1, wherein the match circuit comprises a variable capacitor, and wherein adjusting a capacitance of the variable capacitor adjusts the impedance.

9. A method comprising:
producing, by a power supply, an electric current;
receiving, by a match circuit, the electric current from the power supply;
presenting, by the match circuit, an impedance to the power supply;

directing, by a first leg of a splitter circuit, a first portion of the electric current from the match circuit to a first process chamber, wherein the first leg comprises a first capacitor; and directing by a second leg of the splitter circuit, a second portion of the electric current from the match circuit to a second process chamber, wherein the second leg comprises a second capacitor.

10. The method of claim 9, wherein the first process chamber is connected in series with the first capacitor.

11. The method of claim 9, wherein the first process chamber is connected in parallel with the first capacitor.

12. The method of claim 9, wherein the first capacitor is a variable capacitor, and wherein adjusting a capacitance of the first capacitor adjusts the first portion of the electric current.

13. The method of claim 9, wherein the first leg further comprises a first inductor connected in series with the first capacitor.

14. The method of claim 13, wherein the first inductor is a variable inductor, and wherein adjusting an inductance of the first inductor adjusts the first portion of the electric current.

15. The method of claim 9, wherein the first leg further comprises a first resistor connected in series with the first capacitor.

16. The method of claim 9, wherein the match circuit comprises a variable capacitor, and wherein adjusting a capacitance of the variable capacitor adjusts the impedance.

17. A wafer processing system comprising:

a match circuit arranged to receive an electric current from a power supply and to present an impedance to the power supply; and a splitter circuit comprising:

a first leg is configured to direct a first portion of the electric current from the match circuit to a first electrode; and a second leg is configured to direct a second portion of the electric current from the match circuit to a second electrode, wherein the first electrode and the second electrode are positioned within different process chambers.

18. The wafer processing system of claim 17, wherein the first leg comprises a first capacitor connected in series with the first electrode.

19. The wafer processing system of claim 17, wherein the first leg comprises a first capacitor connected in parallel with the first electrode.

20. The wafer processing system of claim 17, wherein the match circuit comprises a variable capacitor, and wherein adjusting a capacitance of the variable capacitor adjusts the impedance.

* * * * *